United States Patent
Baccouche

(10) Patent No.: US 12,411,163 B2
(45) Date of Patent: Sep. 9, 2025

(54) METHOD AND SYSTEM FOR INLINE CALIBRATION OF MULTIPLE RADIO FREQUENCY SIGNALS FED TO THE SAME DEVICE UNDER TEST

(71) Applicant: Rohde & Schwarz GmbH & Co. KG, Munich (DE)

(72) Inventor: Bessem Baccouche, Zorneding (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 202 days.

(21) Appl. No.: 18/304,254

(22) Filed: Apr. 20, 2023

(65) Prior Publication Data
US 2024/0353460 A1    Oct. 24, 2024

(51) Int. Cl.
G01R 35/00    (2006.01)
G01R 29/08    (2006.01)

(52) U.S. Cl.
CPC ....... G01R 29/0892 (2013.01); G01R 35/005 (2013.01)

(58) Field of Classification Search
CPC .............. G01R 29/0892; G01R 35/005; G01R 31/2822
See application file for complete search history.

(56) References Cited

U.S. PATENT DOCUMENTS

| | | |
|---|---|---|
| 7,292,625 B2 | 11/2007 | Hsu |
| 7,429,866 B2 | 9/2008 | Beene |
| 7,590,078 B2 | 9/2009 | Nanda |
| 9,246,614 B2 | 1/2016 | Berg et al. |
| 10,389,458 B2 | 8/2019 | Hotra et al. |
| 2003/0039319 A1 | 2/2003 | Engelse et al. |
| 2015/0124713 A1* | 5/2015 | Salhov .................. H01Q 3/2605 370/329 |
| 2022/0252651 A1* | 8/2022 | Mueller ................. H04B 17/21 |

FOREIGN PATENT DOCUMENTS

| | | |
|---|---|---|
| CN | 2234096 Y | 8/1996 |
| CN | 201166690 Y | 12/2008 |
| CN | 201555943 U | 8/2010 |
| CN | 101706564 B | 12/2011 |
| CN | 202267727 U | 6/2012 |
| CN | 202533541 U | 11/2012 |

(Continued)

*Primary Examiner* — Alesa Allgood
(74) *Attorney, Agent, or Firm* — Studebaker Brackett PLLC

(57) ABSTRACT

A method for inline calibration of multiple radio frequency signals fed to the same device under test is provided. Said method comprises the steps of supplying multiple radio frequency signals to the device under test and measuring at least one characteristic of the device under test based on said multiple radio frequency signals, monitoring at least phase and/or amplitude of each of the multiple radio frequency signals during the ongoing supplying to the device under test, producing, based on the monitoring, a monitoring signal indicating the relative phase and/or amplitude of the multiple radio frequency signals, and inline adjusting, based on the thus produced monitoring signal, the corresponding phase and/or the corresponding amplitude of one, more or all of the multiple radio frequency signals while they are supplied to the device under test.

21 Claims, 4 Drawing Sheets

(56) References Cited

FOREIGN PATENT DOCUMENTS

| | | | |
|---|---|---|---|
| CN | 202837457 U | 3/2013 | |
| CN | 102360052 B | 6/2013 | |
| CN | 203101617 U | 7/2013 | |
| CN | 203217027 U | 9/2013 | |
| CN | 204214981 U | 3/2015 | |
| CN | 103176161 B | 5/2015 | |
| CN | 205898939 U | 1/2017 | |
| CN | 107643470 A | 1/2018 | |
| CN | 207020272 U | 2/2018 | |
| CN | 207336678 U | 5/2018 | |
| CN | 208172138 U | 11/2018 | |
| CN | 108205093 B | 5/2020 | |
| CN | 111130653 A | 5/2020 | |
| JP | 2008164418 | * | 7/2008 |

* cited by examiner

METHOD AND SYSTEM FOR INLINE CALIBRATION OF MULTIPLE RADIO FREQUENCY SIGNALS FED TO THE SAME DEVICE UNDER TEST

TECHNICAL FIELD

The present disclosure relates to a method for inline calibration of multiple radio frequency signals fed to the same device under test, and an inline calibration system for multiple radio frequency signals fed to the same device under test.

BACKGROUND ART

Generally, in times of an increasing number of applications employing devices transmitting and/or receiving a multitude of radio frequency signals simultaneously or in parallel, respectively, there is a growing need of methods and systems for performing measurements with respect to such devices in a highly accurate and efficient manner in order to verify functioning of such applications.

In the context of performing such measurements with respect to said devices, it is crucial that the corresponding calibration is always maintained even if variations in temperature occur. Otherwise, measurement errors are to be feared.

Usually, in the case of temperature fluctuations, the corresponding measurements are interrupted and a new calibration is performed before said measurements are continued. Accordingly, the corresponding measuring personnel does disadvantageously not only lose time but is also prevented for other measuring tasks. Unfortunately, there is no solution for performing such measurements without interruption in the case of a recalibration is needed.

SUMMARY

Thus, there is a need to provide a method for inline calibration of multiple radio frequency signals fed to the same device under test, and an inline calibration system for multiple radio frequency signals fed to the same device under test, which allow for interruption-free measurements even in the case of a necessary recalibration exemplarily due to temperature fluctuations, thereby ensuring a particularly high accuracy and efficiency.

This is achieved by the embodiments provided in the enclosed independent claims. Advantageous implementations of the present disclosure are further defined in the dependent claims.

According to a first aspect of the present disclosure, a method for inline calibration of multiple radio frequency signals fed to the same device under test is provided. Said method comprises the steps of supplying multiple radio frequency signals to the device under test and measuring at least one characteristic of the device under test based on said multiple radio frequency signals, monitoring at least phase and/or amplitude of each of the multiple radio frequency signals during the ongoing supplying to the device under test, producing, based on the monitoring, a monitoring signal indicating the relative phase and/or amplitude of the multiple radio frequency signals, and inline adjusting, based on the thus produced monitoring signal, the corresponding phase and/or the corresponding amplitude of one, more or all of the multiple radio frequency signals while they are supplied to the device under test. Advantageously, this allows for interruption-free measurements even in the case of a necessary recalibration exemplarily due to temperature fluctuations, thereby ensuring a particularly high accuracy and efficiency. Further advantageously, amplitude and/or phase differences between the multiple radio frequency signals can be used for beam forming.

With respect to the multiple radio frequency signals, it is noted that said multiple radio frequency signals can be generated with the aid of at least two radio frequency signal generators or a radio frequency signal generator comprising at least two radio frequency outputs. Advantageously, one of said at least two radio frequency signal generators can be configured as a reference signal generator, whereas the remaining ones are phase and/or amplitude adjusted. By analogy therewith, one of said at least two radio frequency outputs can be configured as a reference output, whereas the remaining ones are phase and/or amplitude adjusted.

With respect to the above-mentioned monitoring, it is noted that said monitoring can be performed with the aid of a monitoring unit or a monitoring device, respectively.

With respect to the above-mentioned inline adjusting, it is noted that said inline adjusting can be performed with the aid of an inline adjusting unit or an inline adjusting device, respectively.

It might be advantageous if the method further comprises the steps of controlling the multiple radio frequency signals and/or the monitoring, and performing signal processing to estimate current parameter correlation of the multiple radio frequency signals.

Accordingly, it might be advantageous if the above-mentioned inline calibration unit or the inline calibration device, respectively, is configured to control the multiple radio frequency signals and/or the monitoring unit or monitoring device, respectively, and to perform signal processing to estimate current parameter correlation of the multiple radio frequency signals especially at the outputs of the at least two signal generators.

With respect to the above-mentioned device under test, it is noted that said device under test may especially comprise at least two inputs, preferably at least two radio frequency inputs. For instance, the device under test can be an antenna, especially a beam forming antenna.

According to an embodiment of the first aspect of the present disclosure, the radio frequency signals are respectively supplied to the device under test by means of one of multiple interconnects and the radio frequency signals are monitored by decoupling a radio frequency signal prior to transmitting them by means of the respective interconnect, during the transmission over the interconnect, or at the device under test side of the interconnect. Advantageously, for instance, coupling out of the radio frequency signals can be anywhere in the corresponding radio frequency signal path, i.e., inside the radio frequency signal generator, radio frequency signal generator end of the interconnect, in the interconnect, or device under test side of the interconnect.

According to a further embodiment of the first aspect of the present disclosure, the step of inline adjusting comprises correcting, especially digitally correcting, at least one of an amplitude difference, a phase difference, a group delay, or any combination thereof. Advantageously, for example, any failure can be corrected in a digital, and thus cost-efficient, manner. Further advantageously, especially for estimating a failure, the multiple radio frequency signals can be recorded and compared. It might be advantageous if said recording is performed continuously.

According to a further embodiment of the first aspect of the present disclosure, the step of inline adjusting comprises the (monitoring and) compensation of non-linearity of the frequency response in case of wideband modulated signals.

According to a further embodiment of the first aspect of the present disclosure, the step of inline adjusting comprises correcting respective path loses especially such that predetermined radio frequency signals occur at the device under test. Advantageously, for instance, influence of the respective path to the device under test can be corrected. Preferably, this happens before the corresponding simulation starts. It might be advantageous if an initial setting is generated.

According to a further embodiment of the first aspect of the present disclosure, correcting the respective path loses is based on pushing a Dirac pulse to the device under test and/or sending a continuous wave in combination with performing a frequency sweep. Advantageously, for example, the distortion within the received frequency band can be controlled at a dedicated position.

According to a further embodiment of the first aspect of the present disclosure, the step of inline adjusting comprises correcting a respective absolute power level of each of the multiple radio frequency signals at the device under test level especially with the aid of at least one power meter. Advantageously, for instance, not only accuracy but also efficiency can further be increased.

According to a further embodiment of the first aspect of the present disclosure, at least one or each of the multiple interconnects comprises or is a coupler and/or a directional coupler and/or a resistive coupler. Advantageously, for example, each of the multiple radio frequency signals can efficiently be split to be supplied for the device under test and for monitoring.

According to a second aspect of the present disclosure, an inline calibration system for multiple radio frequency signals fed to the same device under test is provided. Said system comprising a monitoring unit arranged for monitoring at least phase and/or amplitude of each of the multiple radio frequency signals during the ongoing supplying of said radio frequency signals to the device under test, and for supplying a monitoring signal, and an inline adjusting unit arranged for inline adjusting, based on the monitoring signal, the corresponding phase and/or the corresponding amplitude of one, more or all of the multiple radio frequency signals while they are supplied to the device under test. Advantageously, this allows for interruption-free measurements even in the case of a necessary recalibration exemplarily due to temperature fluctuations, thereby ensuring a particularly high accuracy and efficiency. Further advantageously, amplitude and/or phase differences between the multiple radio frequency signals can be used for beam forming.

With respect to the multiple radio frequency signals, it is noted that the system can comprise at least two radio frequency signal generators for generating said multiple radio frequency signals or a radio frequency signal generator comprising at least two radio frequency outputs for generating said multiple radio frequency signals.

With respect to the device under test, it is noted that the device under test can comprise at least two radio frequency inputs. For example, said device under test can comprise or be an antenna, especially a beam forming antenna.

With respect to the monitoring unit, it is noted that said monitoring unit can comprise or be a monitoring device being especially configured to capture modulated and/or unmodulated radio frequency signals.

With respect to the inline adjusting unit, it is noted that said inline adjusting unit can comprise or be an inline adjusting device.

With respect to the above-mentioned at least two radio frequency signal generators, it is noted that it might be advantageous if one of said at least two radio frequency signal generators is configured as a reference signal generator, whereas the remaining ones are phase and/or amplitude adjusted. Furthermore, a trigger signal may especially be sent from at least one, preferably each, of the at least two radio frequency signal generators to the monitoring unit and/or the inline adjusting unit.

With respect to said trigger signal, it is noted that it might be advantageous if said trigger signal or a trigger, respectively, comprises or is a signal marker, wherein said signal marker especially marks the beginning of the corresponding signal.

According to an embodiment of the second aspect of the present disclosure, the system further comprises multiple interconnects. In this context, the radio frequency signals are respectively supplied to the device under test by means of one of said multiple interconnects and the radio frequency signals are monitored by decoupling a radio frequency signal prior to transmitting them by means of the respective interconnect, or during the transmission over the interconnect, or at the device under test side of the interconnect. Advantageously, for instance, coupling out of the radio frequency signals can be anywhere in the corresponding radio frequency signal path, i.e., inside the radio frequency signal generator, radio frequency signal generator end of the interconnect, in the interconnect, or device under test side of the interconnect.

According to a further embodiment of the second aspect of the present disclosure, at least one or each of the multiple interconnects comprises or is a coupler and/or a directional coupler and/or a resistive coupler. Advantageously, for example, each of the multiple radio frequency signals can efficiently be split to be supplied for the device under test and for the monitoring unit.

According to a further embodiment of the second aspect of the present disclosure, the system further comprises a calibration unit arranged for calibrating the radio frequency signals for at least one characteristic of at least one or each of the interconnects. Advantageously, for instance, at least one of the at least two radio frequency signal generators and/or the inline adjusting unit and/or the monitoring unit can comprise such a calibration unit.

According to a further embodiment of the second aspect of the present disclosure, inline adjusting comprises correcting, especially digitally correcting, at least one of an amplitude difference, a phase difference, a group delay, or any combination thereof. Advantageously, for example, any failure can be corrected in a digital, and thus cost-efficient, manner. Further advantageously, especially for estimating a failure, the multiple radio frequency signals can be recorded and compared by the monitoring unit and/or the inline adjusting unit. It might be advantageous if said recording is performed continuously.

According to a further embodiment of the second aspect of the present disclosure, inline adjusting comprises (monitoring and) compensation of non-linearity of the frequency response in case of wideband modulated signals.

According to a further embodiment of the second aspect of the present disclosure, inline adjusting comprises correcting respective path loses especially such that predetermined radio frequency signals occur at the device under test. Advantageously, for instance, influence of the respective path to the device under test can be corrected. Preferably, this happens before the corresponding simulation starts. It might be advantageous if an initial setting is generated.

According to a further embodiment of the second aspect of the present disclosure, correcting the respective path loses is based on pushing a Dirac pulse to the device under test and/or sending a continuous wave in combination with performing a frequency sweep. Advantageously, for example, the distortion within the received frequency band can be controlled at a dedicated position.

According to a further embodiment of the second aspect of the present disclosure, the system further comprises at least one power meter. In this context, inline adjusting comprises correcting a respective absolute power level of each of the multiple radio frequency signals at the device under test level with the aid of the at least one power meter. Advantageously, for instance, not only accuracy but also efficiency can further be increased.

According to a further embodiment of the second aspect of the present disclosure, the monitoring unit and/or the inline adjusting unit are integrated in a radio frequency signal generator. Advantageously, for example, the required space can be reduced, which leads to an increased efficiency.

According to a further embodiment of the second aspect of the present disclosure, the monitoring unit and/or the inline adjusting unit are external to a radio frequency signal generator. Advantageously, for instance, radio frequency signal generators have not to be modified, thereby ensuring a cost-efficient setup of the system.

According to a further embodiment of the second aspect of the present disclosure, the monitoring unit and/or the inline adjusting unit are integrated in a control device. Advantageously, for example, said control device can be configured to control the multiple radio frequency signals and/or to perform signal processing to estimate current parameter correlation of the multiple radio frequency signals especially at the respective outputs of the at least two radio frequency signal generators or at the at least two radio frequency outputs of the radio frequency signal generator, respectively. Preferably, said current parameter correlation relates to phase and/or amplitude.

According to a further embodiment of the second aspect of the present disclosure, the monitoring unit and/or the inline adjusting unit are integrated in a measurement device and/or a device configured to capture modulated or unmodulated radio frequency signals. Advantageously, for instance, the required space can be reduced, which leads to an increased efficiency.

According to a further embodiment of the second aspect of the present disclosure, the measurement device and/or the device configured to capture modulated or unmodulated radio frequency signals comprises or is a spectrum analyzer and/or a vector network analyzer and/or a scope. Advantageously, for example, a high flexibility, and thus also an increased efficiency, can be ensured.

According to a further embodiment of the second aspect of the present disclosure, the system further comprises a trigger unit arranged for supplying the monitoring unit and/or the inline adjusting unit with a trigger signal. As an alternative, the system further comprises a common timer arranged for supplying the monitoring unit and/or the inline adjusting unit with a common time, especially a system time. Advantageously, for instance, at least one of the at least two radio frequency signal generators can comprise such a trigger unit. Further advantageously, at least one, preferably each, of the at least two radio frequency signal generators can be supplied with said common time or said system time, respectively. It might be advantageous if at least one of the at least two radio frequency signal generators and/or the monitoring unit and/or the inline adjusting unit comprises such a common timer.

Especially in the case that there is no need of a trigger or a common timer is used, respectively, time points can be defined in the monitoring unit and/or the inline adjusting unit, at which calibration measurements take place. Advantageously, by knowing the desired value of the corresponding signal at this time point, one can measure the error and correct it.

Especially in this context, with respect to the monitoring unit and/or the inline adjusting unit, it is noted that it might be advantageous if alternatively to a coherent signal capture, a summation of the split signal is fed to the monitoring unit and/or the inline adjusting unit, wherein the monitoring unit and/or the inline adjusting unit are configured as a single channel capture unit or a single channel capture device, respectively. The advantage is that all information is in one signal and correlated to each other. Preferably, the signals are orthogonal to each other, for example, in the sense of a time or frequency multiplex. Furthermore, the monitoring unit and/or the inline adjusting unit can demodulate the signals and extract the information.

The above description with regard to the method according to the first aspect of the disclosure is correspondingly valid for the system according to the second aspect of the disclosure, and vice versa.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTIONS OF EMBODIMENTS

Figure 1:
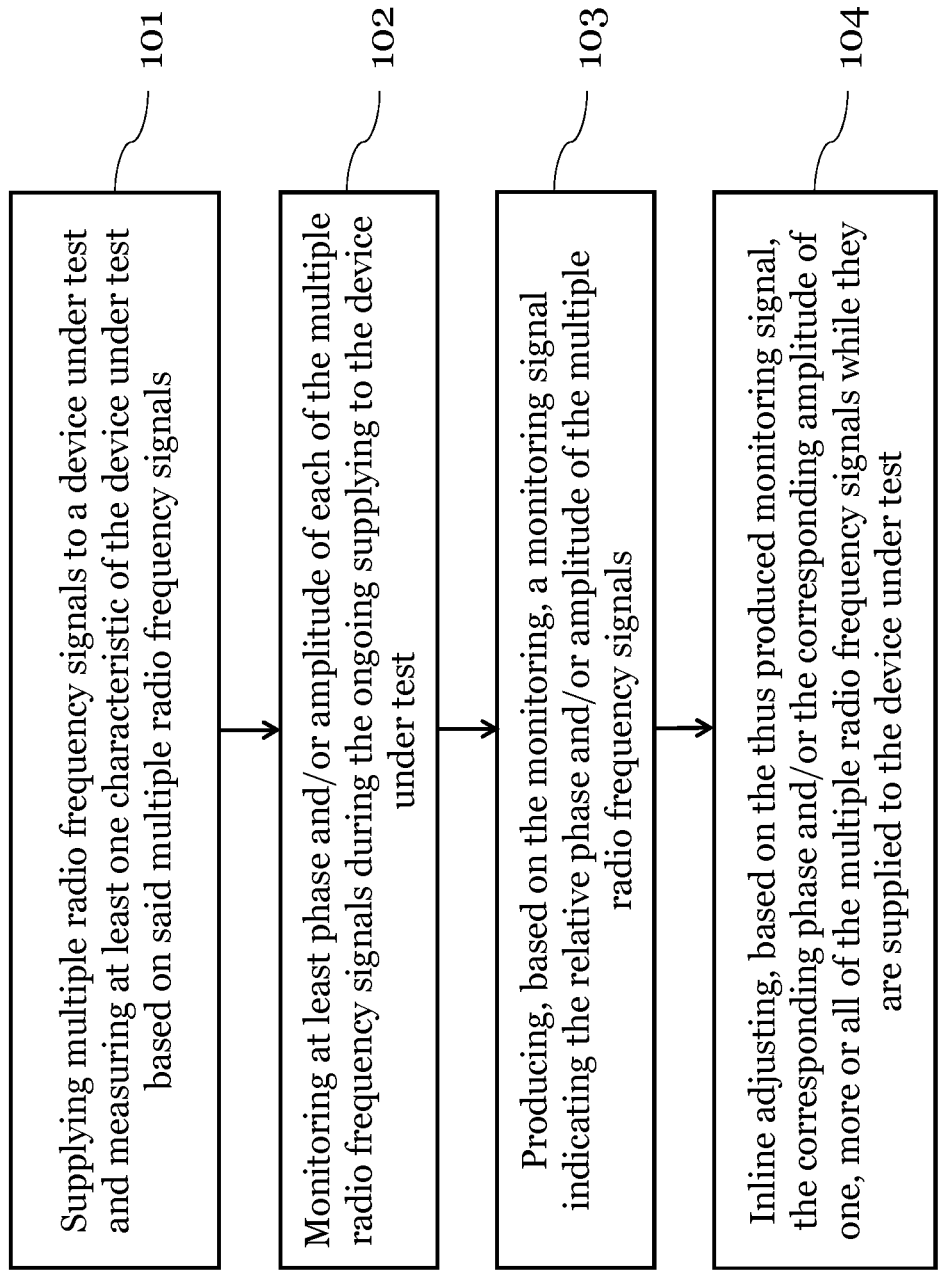
FIG. 1 shows a flow diagram of a method for inline calibration of multiple radio frequency signals fed to the same device under test according to an embodiment.

FIG. 1 illustrates a flow diagram of a method for inline calibration of multiple radio frequency signals fed to the same device under test according to an embodiment.

A first step 101 comprises supplying multiple radio frequency signals to the device under test and measuring at least one characteristic of the device under test based on said multiple radio frequency signals. Furthermore, a second step 102 comprises monitoring at least phase and/or amplitude of each of the multiple radio frequency signals during the ongoing supplying to the device under test. Moreover, a third step 103 comprises producing, based on the monitoring, a monitoring signal indicating the relative phase and/or amplitude of the multiple radio frequency signals. In addition to this, a fourth step 104 comprises inline adjusting, based on the thus produced monitoring signal, the corresponding phase and/or the corresponding amplitude of one, more or all of the multiple radio frequency signals while they are supplied to the device under test.

It is noted that it might be advantageous if the radio frequency signals are respectively supplied to the device under test by means of one of multiple interconnects and the radio frequency signals are monitored by decoupling a radio frequency signal prior to transmitting them by means of the respective interconnect, or during the transmission over the interconnect, or at the device under test side of the interconnect.

With respect to the above-mentioned step 104, it is noted that it might be advantageous if the step of inline adjusting comprises correcting, especially digitally correcting, at least one of an amplitude difference, a phase difference, a group delay, or any combination thereof.

In addition to this or as an alternative, it might be advantageous if the step of inline adjusting comprises correcting respective path loses especially such that predetermined radio frequency signals occur at the device under test.

In this context, it is further noted that it might be advantageous if correcting the respective path loses is based on pushing a Dirac pulse to the device under test and/or sending a continuous wave in combination with performing a frequency sweep.

Again, with respect to the above-mentioned step 104, it might be advantageous if the step of inline adjusting comprises correcting a respective absolute power level of each of the multiple radio frequency signals at the device under test level especially with the aid of at least one power meter.

With respect to the above-mentioned interconnects, it is noted that it might be advantageous if at least one or each of the multiple interconnects comprises or is a coupler and/or a directional coupler and/or a resistive coupler.

Figure 2:
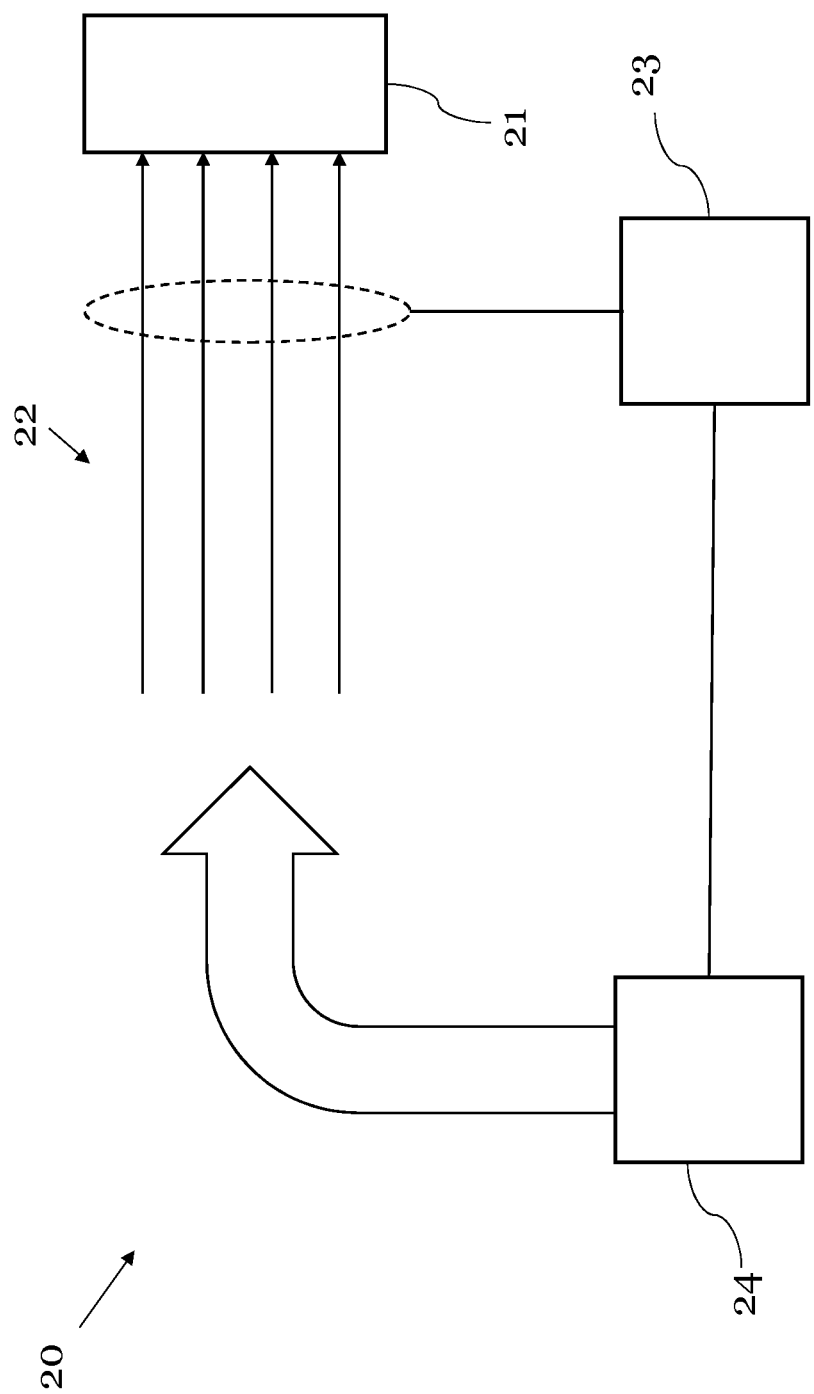
FIG. 2 shows a schematic diagram of an inline calibration system for multiple radio frequency signals fed to the same device under test according to an embodiment.

Now, with respect to FIG. 2, a schematic diagram of an inline calibration system 20 for multiple radio frequency signals 22 fed to the same device under test 21 according to an embodiment is depicted.

Said system 20 comprises a monitoring unit 23 or a monitoring device, respectively, arranged for monitoring at least phase and/or amplitude of each of the multiple radio frequency signals 22 during the ongoing supplying of said radio frequency signals 22 to the device under test 21, and for supplying a monitoring signal.

In addition to this, the system 20 comprises an inline adjusting unit 24 or an inline adjusting device, respectively, arranged for inline adjusting, based on the monitoring signal, the corresponding phase and/or the corresponding amplitude of one, more or all of the multiple radio frequency signals 22 while they are supplied to the device under test 21.

Figure 3:
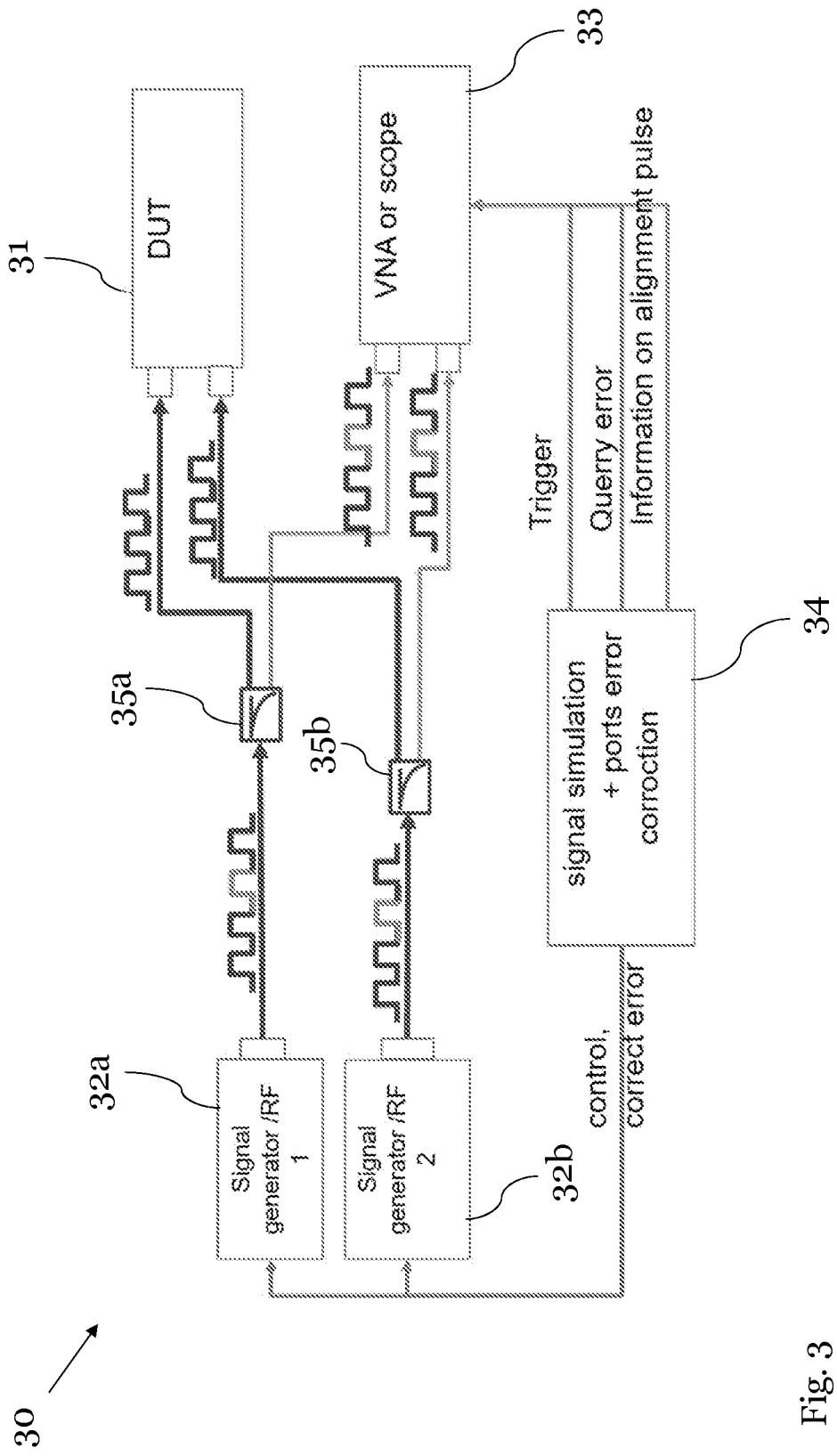
FIG. 3 shows a schematic diagram of an inline calibration system for multiple radio frequency signals fed to the same device under test according to a further embodiment.

Now, with respect to FIG. 3, a schematic diagram of an inline calibration system 30 for multiple radio frequency signals fed to the same device under test 31 according to a further embodiment is illustrated.

Exemplarily, said multiple radio frequency signals are generated by multiple signal generators, especially the two signal generators 32a, 32b. Accordingly, the system 30 comprises said multiple signal generators, exemplarily the signal generators 32a, 32b. It is noted that the above-mentioned system 20 of FIG. 2 can analogously comprise multiple signal generators for generating the multiple radio frequency signals.

As it can further be seen from FIG. 3, the system 30 further comprises multiple interconnects, exemplarily one interconnect per signal generator, namely the two interconnects 35a, 35b. In this context, the radio frequency signals are respectively supplied to the device under test 31 by means of one of said multiple interconnects 35a, 35b and the radio frequency signals are monitored by decoupling a radio frequency signal prior to transmitting them by means of the respective interconnect, or during the transmission over the interconnect, or at the device under test side of the interconnect. Exemplarily, the radio frequency signals are monitored by decoupling the respective one at the device under test side of the corresponding interconnect of said interconnects 35a, 35b.

In accordance with FIG. 3, especially for monitoring the radio frequency signals, the system 30 comprises a vector network analyzer or a scope 33. Accordingly, it is noted that the monitoring unit 23 or the monitoring device, respectively, can be a vector network analyzer or a scope.

With respect to the above-mentioned interconnects 35a, 35b, it is noted that it might be advantageous if at least one or each of the multiple interconnects comprises or is a coupler and/or a directional coupler and/or a resistive coupler.

Furthermore, the system 30 further comprises an inline adjusting unit 34 or an inline adjusting device, respectively, such as the one 24 of FIG. 2, arranged for inline adjusting, based on a monitoring signal supplied by the vector network analyzer or scope 33, the corresponding phase and/or the corresponding amplitude of one, more or all of the multiple radio frequency signals while they are supplied to the device under test 31.

With respect to the inline adjusting unit 34 or the inline adjusting device, respectively, it is noted that said inline adjusting unit 34 or said inline adjusting device, respectively, can perform a signal simulation and/or a ports error correction.

Exemplarily, the inline adjusting unit 34 or the inline adjusting device, respectively, is configured to control each of the signal generators 32a, 32b and/or to correct errors with respect to each of said signal generators 32a, 32b.

As it can further be seen from FIG. 3, the inline adjusting unit 34 or the inline adjusting device, respectively, and the vector network analyzer or scope 33 may exchange at least one of a trigger, a query error, information on alignment pulse, or any combination thereof. Especially in the context of triggering, the system 30, exemplarily the inline adjusting unit 34 or the inline adjusting device, respectively, or the vector network analyzer or scope 33, can further comprise a trigger unit arranged for supplying the inline adjusting unit 34 or the inline adjusting device, respectively, and/or the vector network analyzer or scope 33 with a trigger signal.

It is noted that this may analogously apply for the above-mentioned monitoring unit 23 or monitoring device, respectively, of FIG. 2. Accordingly, the inline adjusting unit 24 or the inline adjusting device, respectively, and the monitoring unit 23 or the monitoring device, respectively, may exchange at least one of a trigger, a query error, information on alignment pulse, or any combination thereof.

Basically, the explanations regarding the monitoring unit 23 or the monitoring device, respectively, can analogously apply for the vector network analyzer or scope 33, and vice versa, whereas the explanations regarding the inline adjusting unit 24 or the inline adjusting device, respectively, can analogously apply for the inline adjusting unit 34 or the inline adjusting device, respectively. This can analogously apply for the inline adjusting unit 44 or the inline adjusting device, respectively, and/or the vector network analyzer or scope 43 of FIG. 4, and vice versa.

It is further noted that it might be advantageous if the system 30 further comprises a calibration unit or a calibration device, respectively, arranged for calibrating the radio frequency signals for at least one characteristic of at least one or each of the interconnects 35a, 35b. Exemplarily, the inline adjusting unit 34 or the inline adjusting device, respectively, can comprise such a calibration unit or calibration device, respectively. Additionally or alternatively, the vector network analyzer or scope 33 can comprise such a calibration unit or calibration device, respectively.

With respect to inline adjusting performed by the inline adjusting unit 34 or the inline adjusting device, respectively, it is noted that it might be advantageous if inline adjusting comprises correcting, especially digitally correcting, at least one of an amplitude difference, a phase difference, a group delay, or any combination thereof.

In addition to this or as an alternative, it might be advantageous if inline adjusting comprises correcting respective path loses especially such that predetermined radio frequency signals occur at the device under test.

In this context, it is noted that it might be advantageous if correcting the respective path loses is based on pushing a Dirac pulse to the device under test and/or sending a continuous wave in combination with performing a frequency sweep.

It is further noted that it might be advantageous if the system 30 further comprises at least one power meter, wherein inline adjusting comprises correcting a respective absolute power level of each of the multiple radio frequency signals at the device under test level with the aid of the at least one power meter. Exemplarily, the inline adjusting unit 34 or the inline adjusting device, respectively, can comprise said at least one power meter.

Exemplarily, as it can be seen from FIG. 3, the inline adjusting unit 34 or the inline adjusting device, respectively, and the vector network analyzer or scope 33 are external to the radio frequency signal generators 32a, 32b.

Especially as an alternative, it is noted that the inline adjusting unit 34 or the inline adjusting device, respectively, and/or the vector network analyzer or scope 33 can be integrated in at least one or each of the radio frequency signal generators 32a, 32b.

Furthermore, the inline adjusting unit 34 or the inline adjusting device, respectively, and/or the vector network analyzer or scope 33 can be integrated in a control device.

Moreover, the inline adjusting unit 34 or the inline adjusting device, respectively, can be integrated in the vector network analyzer or scope 33.

With respect to the vector network analyzer or scope 33, it is noted that said vector network analyzer or scope 33 can alternatively be a spectrum analyzer.

Figure 4:
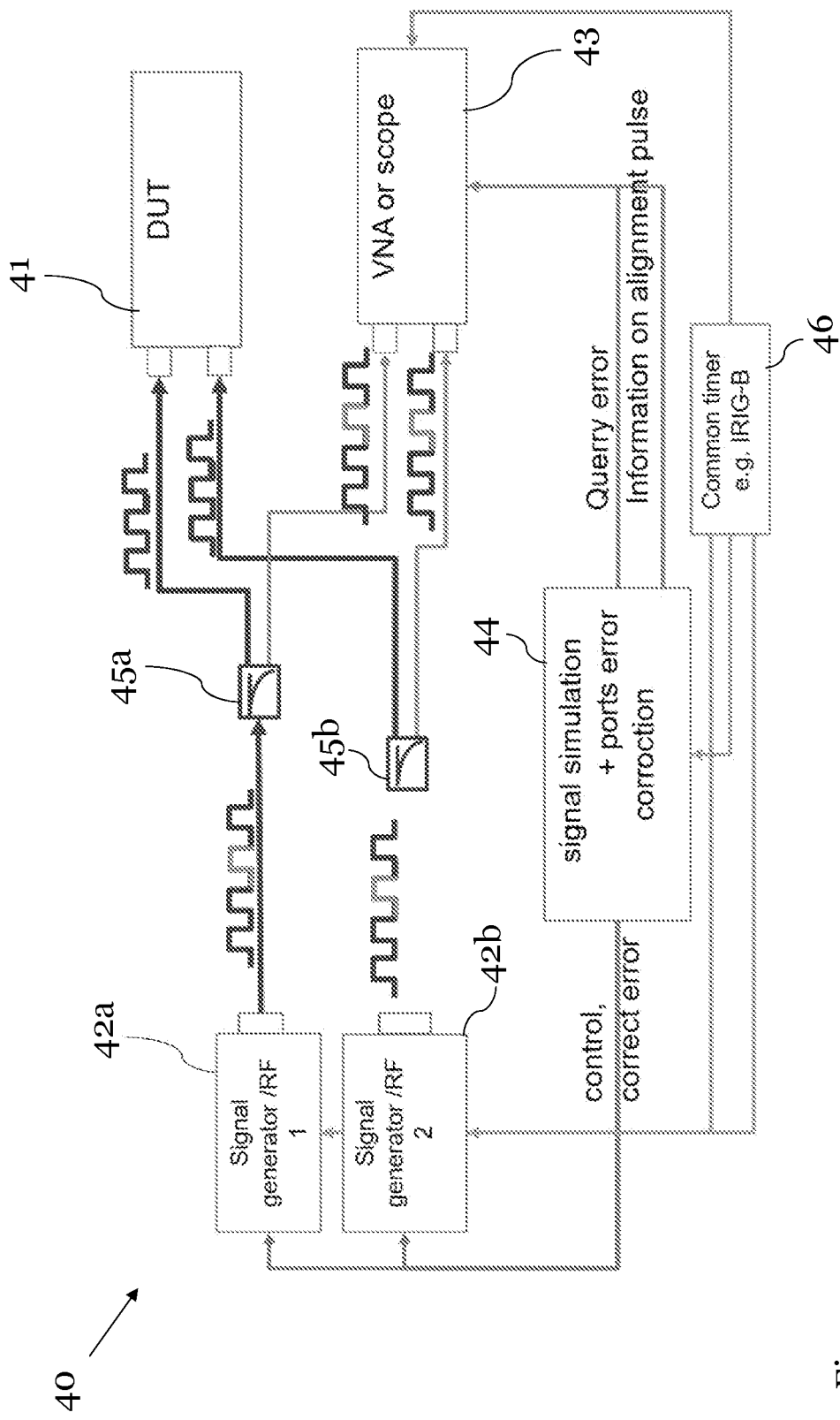
FIG. 4 shows a schematic diagram of an inline calibration system for multiple radio frequency signals fed to the same device under test according to a further embodiment.

Finally, with respect to FIG. 4, a schematic diagram of an inline calibration system 40 for multiple radio frequency signals fed to the same device under test 41 according to a further embodiment is shown.

Said system 40 of FIG. 4 differs from the system 30 according to FIG. 3 especially in that there is no trigger exchanged between the inline adjusting unit 44 or the inline adjusting device, respectively, and the vector network analyzer or scope 43.

In this exemplarily case of an omitted trigger, the system 40 further comprises a common timer 46 arranged for supplying the inline adjusting unit 44 or the inline adjusting device, respectively, and/or the vector network analyzer or scope 43 and/or the multiple radio frequency signal generators 42a, 42b with a common time, especially a system time.

With respect to said common time or system time, respectively, it is noted that it might be advantageous if an Inter Range Instrumentation Group (IRIG) timecode is used. Preferably, an IRIG-B timecode can be used.

It is further noted that the radio frequency signal generators 42a, 42b are not explained in greater detail because the explanations above regarding the signal generators 32a, 32b can analogously apply. This can analogously apply for the device under test 41 and the device under test 31, for the vector network analyzer or scope 43 and the vector network analyzer or scope 33, for the inline adjusting unit 44 or the inline adjusting device, respectively, and the inline adjusting unit 34 or the inline adjusting device, respectively, for the interconnects 45a, 45b and the interconnects 35a, 35b.

All features described above or features shown in the figures can be combined with each other in any advantageous manner within the scope of the disclosure.

What is claimed is:

1. A method for inline calibration of multiple radio frequency signals fed to the same device under test, the method comprising the steps of:
   supplying multiple radio frequency signals to the device under test and measuring at least one characteristic of the device under test based on said multiple radio frequency signals,
   monitoring at least phase and/or amplitude of each of the multiple radio frequency signals during the ongoing supplying to the device under test,
   producing, based on the monitoring, a monitoring signal indicating the relative phase and/or amplitude of the multiple radio frequency signals, and
   inline adjusting, based on the thus produced monitoring signal, the corresponding phase and/or the corresponding amplitude of one, more or all of the multiple radio frequency signals while they are supplied to the device under test,
   wherein the step of inline adjusting comprises digitally correcting, at least one of an amplitude difference, a phase difference, a group delay, or any combination thereof.

2. The method according to claim 1,
   wherein the step of inline adjusting comprises correcting respective path loses especially such that predetermined radio frequency signals occur at the device under test.

3. The method according to claim 1,
   wherein the step of inline adjusting comprises correcting a respective absolute power level of each of the multiple radio frequency signals at the device under test level especially with the aid of at least one power meter.

4. The method according to claim 1,
   wherein the radio frequency signals are respectively supplied to the device under test by means of one of multiple interconnects and the radio frequency signals are monitored by decoupling a radio frequency signal prior to transmitting them by means of the respective interconnect, or
   during the transmission over the interconnect, or
   at the device under test side of the interconnect.

5. The method according to claim 4,
   wherein at least one or each of the multiple interconnects comprises or is a coupler and/or a directional coupler and/or a resistive coupler.

6. The method of claim 1,
   wherein the step of inline adjusting comprises the compensation of non-linearity of the frequency response of a wideband modulated signals.

7. The method according to claim 6,
   wherein correcting the respective path loses is based on pushing a Dirac pulse to the device under test and/or sending a continuous wave in combination with performing a frequency sweep.

8. An inline calibration system for multiple radio frequency signals fed to the same device under test, the system comprising:
a monitoring unit arranged for monitoring at least phase and/or amplitude of each of the multiple radio frequency signals during the ongoing supplying of said radio frequency signals to the device under test, and for supplying a monitoring signal,
and
an inline adjusting unit comprising a calibration device configured to perform digital correction of at least one of an amplitude difference, a phase difference, a group delay, or any combination thereof of one, more or all of the multiple radio frequency signals, based on the monitoring signal, while the multiple radio frequency signals are supplied to the device under test.

9. The system according to claim 8,
wherein the system further comprises at least one power meter,
wherein inline adjusting comprises correcting a respective absolute power level of each of the multiple radio frequency signals at the device under test level with the aid of the at least one power meter.

10. The system according to claim 8,
wherein the monitoring unit and/or the inline adjusting unit are integrated in a radio frequency signal generator.

11. The system according to claim 8,
wherein the monitoring unit and/or the inline adjusting unit are external to a radio frequency signal generator.

12. The system according to claim 8,
wherein the monitoring unit and/or the inline adjusting unit are integrated in a control device.

13. The system according to claim 8,
wherein the monitoring unit and/or the inline adjusting unit are integrated in a measurement device and/or a device configured to capture modulated or unmodulated radio frequency signals.

14. The system according to claim 8,
wherein the device configured to capture modulated or unmodulated radio frequency signals comprises or is a spectrum analyzer and/or a vector network analyzer and/or a scope.

15. The system according to claim 8,
wherein the system further comprises a trigger unit arranged for supplying the monitoring unit and/or the inline adjusting unit with a trigger signal, or
wherein the system further comprises a common timer arranged for supplying the monitoring unit and/or the inline adjusting unit with a common time, especially a system time.

16. The system according to claim 8, wherein the inline adjusting unit is further configured to control the multiple radio frequency signals and/or the monitoring unit, and to perform signal processing to estimate current parameter correlation of the multiple radio frequency signals.

17. The system according to claim 8,
wherein the system further comprises multiple interconnects,
wherein the radio frequency signals are respectively supplied to the device under test by means of one of said multiple interconnects and the radio frequency signals are monitored by decoupling a radio frequency signal prior to transmitting them by means of the respective interconnect, or
during the transmission over the interconnect, or
at the device under test side of the interconnect.

18. The system according to claim 17,
wherein at least one or each of the multiple interconnects comprises or is a coupler and/or a directional coupler and/or a resistive coupler.

19. The system according to claim 17,
wherein the system further comprises a calibration unit arranged for calibrating the radio frequency signals for at least one characteristic of at least one or each of the interconnects.

20. The system according to claim 8,
wherein inline adjusting comprises correcting respective path loses especially such that predetermined radio frequency signals occur at the device under test.

21. The system according to claim 20,
wherein correcting the respective path loses is based on pushing a Dirac pulse to the device under test and/or sending a continuous wave in combination with performing a frequency sweep.

* * * * *